US006541942B1

(12) United States Patent
Francis (10) Patent No.: US 6,541,942 B1
(45) Date of Patent: Apr. 1, 2003

(54) CAPACITOR TUB ASSEMBLY AND METHOD OF COOLING

(75) Inventor: David Francis, Stevenson Ranch, CA (US)

(73) Assignee: AeroVironment, Inc., Monrovia, CA (US)

( * ) Notice: Subject to any disclaimer, the term of this patent is extended or adjusted under 35 U.S.C. 154(b) by 0 days.

(21) Appl. No.: 09/991,289

(22) Filed: Nov. 13, 2001

(51) Int. Cl.[7] ........................ H01M 10/44; H01M 10/46
(52) U.S. Cl. ......................................................... 320/166
(58) Field of Search ................................. 320/147, 150, 320/153, 166, 167; 361/500, 517, 519, 521, 522, 535, 537, 538, 688

(56) References Cited

U.S. PATENT DOCUMENTS 3,865,183 A * 2/1975 Roush
4,670,814 A * 6/1987 Matsui et al.
4,901,138 A * 2/1990 Kushibiki et al.
5,577,747 A   11/1996 Ogawa et al. .............. 180/220

* cited by examiner

Primary Examiner—Edward H. Tso
(74) Attorney, Agent, or Firm—Sheppard, Mullin, Richter & Hampton LLP; James R. Brueggemann (57) ABSTRACT

An capacitor tub assembly which includes arrays of capacitor cells coupled in series and grouped into sub-packs. The capacitors within each sub-pack being electrically coupled via a unique printed circuit board (PCB) design, wherein individual PCBs cover the top and bottom ends of each sub-pack. Each sub-pack is further electrically coupled to each of the other adjacent sub-packs within the tub assembly, thereby ensuring that all the capacitor cells in the capacitor tub assembly are electrically coupled. The capacitor tub assembly is further comprised of voltage equalization circuitry which ensures even distribution of voltage and power over all of the individual capacitors within the tub assembly, a cooling design and temperature electronics for monitoring the temperature and voltages of the individual capacitor cells within each sub-pack and cooling the cells (when necessary) from all four quarters, and rapid discharge circuitry for discharging the capacitors to a safe voltage level in the event of a system fault or error.

25 Claims, 5 Drawing Sheets

CAPACITOR TUB ASSEMBLY AND METHOD OF COOLING

FIELD OF THE INVENTION

The invention relates generally to the use of large scale batteries in electrical vehicles and portable electronic devices. More specifically, the invention relates to a capacitor tub assembly used separately or in concert with conventional batteries, and a method for cooling the tub assembly

BACKGROUND OF THE INVENTION

High end capacitors, such as ultra-capacitors, are high-energy, high-power density electrochemical devices that are easy to charge and discharge. They are basically capacitors that can store a lot more energy than standard electrolytic type capacitors. They store energy in a polarized liquid layer between an anode and cathode. As with conventional capacitors, the energy storage ability of an ultra-capacitor can be increased by increasing the surface area of the plates. Ultra-capacitors are commonly used as load leveling devices in electrical cars or vehicles, or portable electronics (such as portable computers). These new ultra-capacitors may be used alone or in concert with conventional batteries in order to extend the life of the conventional batteries by boosting the output of the batteries when power demand is at a peak.

One of the main advantages of an electric vehicle of any type is its capability to regenerate or recycle energy. Energy is generated in the electronic vehicle in order to brake the vehicle during sudden stops or de-acceleration. This energy may be recycled and used for re-acceleration of the vehicle, thus increasing the vehicle's overall efficiency. The speed and efficiency with which the storage system is able to accept and return the energy flow is, clearly, the most important characteristic of the electronic vehicle's performance. Due to acutely short deceleration response times, large amounts of energy are generated very quickly and only ultra-capacitors are capable of accepting and storing such a large scale inrush of energy in such a short cycle with minimum losses. Accordingly, ultra-capacitors could one day enable electronic vehicles to accelerate as quickly as conventional automobiles without sacrificing range, and even recharge during de-acceleration. Likewise, these ultra-capacitors could provide extra power for portable computers on initial power-up and during the operation of hard-drives, allowing manufacturers to use smaller batteries for the less demanding energy requirements of a computer.

However, when designing large arrays of high end capacitors, such as ultra-capacitors, for storing and providing large amounts of power, there are considerable design and safety requirements which must be considered, including equalization of power and voltage over all the capacitor cells, voltage and temperature considerations to ensure that the cells do not reach unsafe temperatures or pose dangerously high voltage threats to human personnel, discharge capability in the event of any errors or faults, and overall size and structure sufficient to house the capacitor cells while protecting the individual capacitor cells from operating environments and providing efficient usability and serviceability.

It therefore will be appreciated that there is a need for large arrays of capacitors for storing and providing large amounts of power within short cycle periods. These arrays must be properly designed to ensure that the capacitors evenly charge and discharge and do not reach high temperatures which could affect the operation of the capacitors. The present invention satisfies this need.

SUMMARY OF THE INVENTION

The present invention is directed toward a design for and method of fabricating an capacitor tub assembly which may be used alone or in concert with large scale batteries for powering electric vehicles and/or portable electronic devices. The capacitor tub assembly of the present invention preferably includes arrays of capacitor cells coupled in series and grouped into sub-packs. The capacitors within each sub-pack are electrically coupled via a unique printed circuit board (PCB) design, wherein individual PCBs cover the top and bottom ends of each sub-pack. Each sub-pack is further electrically coupled to at least two of the other adjacent sub-packs within the tub assembly, thereby ensuring that all the capacitor cells in the capacitor tub assembly are electrically coupled in series. The capacitor tub assembly is further comprised of voltage equalization circuitry which ensures even distribution of voltage and power over all of the individual capacitors within the tub assembly. The present invention further includes a cooling design and temperature electronics for monitoring the temperature and voltages of the individual capacitor cells within each sub-pack and cooling the individual capacitor cells (when necessary) from all four quarters. The capacitor tub assembly of the present invention further includes rapid discharge circuitry for discharging the capacitors to a safe voltage level in the event of a system fault or error in order to avoid danger to human personnel posed by the high voltages of these capacitors.

Finally, the present invention also includes a high voltage interlock (HVIL) switch. The HVIL switch is a two wire connection between high voltage components in the electric vehicle and the capacitor tub assembly. The HVIL switch operates as a safety switch between these high voltage components and the capacitor tub assembly. It prevents the components from being energized if any one of them is not properly installed within the vehicle and/or de-energizes the vehicle and discharges the capacitor assembly down to a safe voltage level if any of the components is compromised.

DETAILED DESCRIPTION OF THE PREFERRED EMBODIMENT

Main Capacitor Tub Assembly Design

Figure 1:
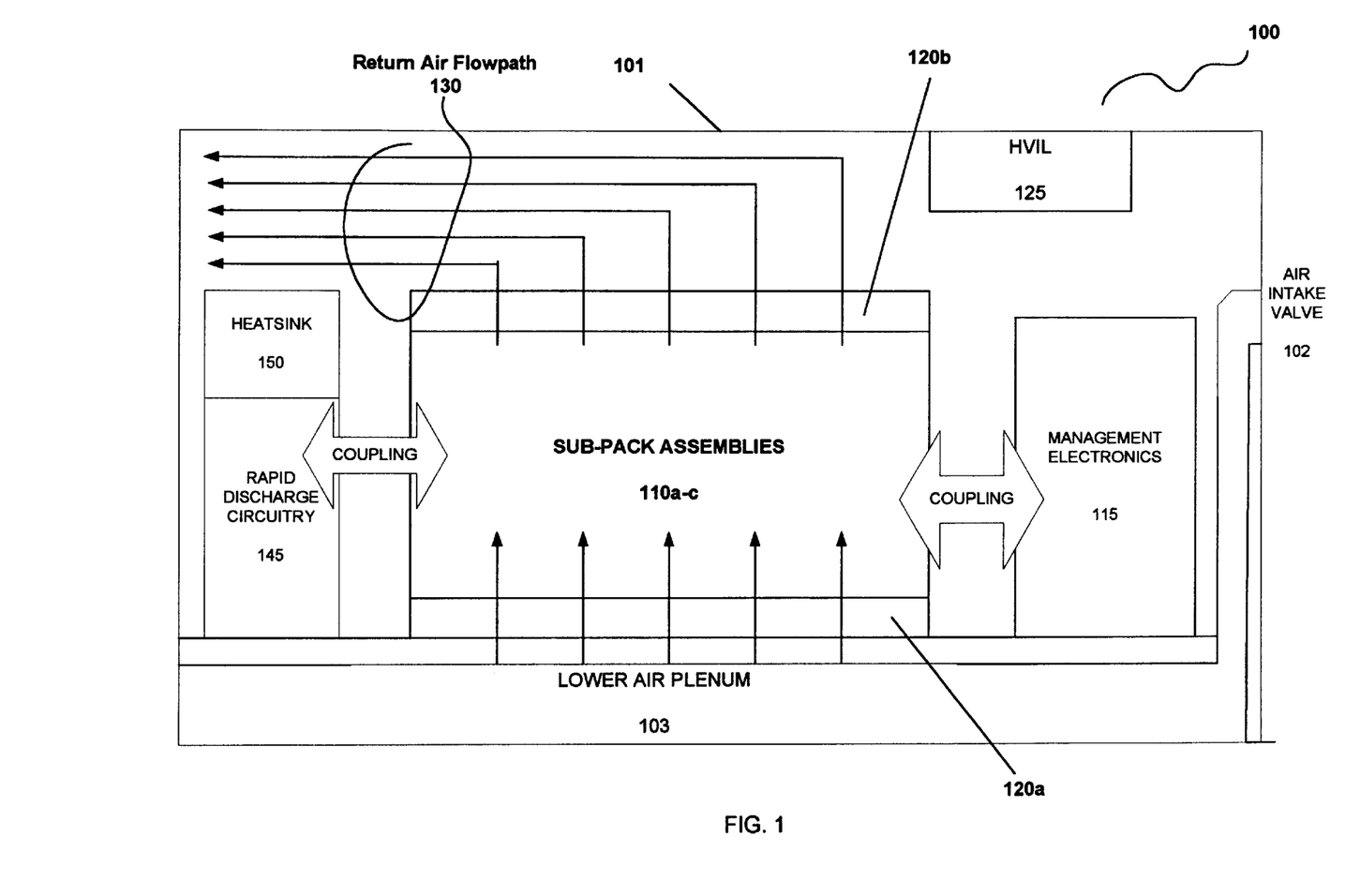
FIG. 1 is a cross-sectional schematic view of the capacitor tub assembly of the present invention.

FIG. 1 illustrates a cross-sectional schematic view of the capacitor tub assembly 100 of the present invention. As shown, in a preferred embodiment, the capacitor tub assembly 100 is encased in a non-conductive enclosure preferably having a steel reinforced exterior frame 101. The non-conductive enclosure may be made out of any non-conductive material; but, is preferably made from a material resistant to higher temperatures such as fiberglass. In a preferred embodiment, the interior of the capacitor tub assembly includes a main chamber for housing the capacitors, a lower air plenum for receiving and providing cool air to the capacitors, and a return air flow path with a heat sink 150.

In a preferred embodiment, one side of the capacitor tub assembly 100 includes a filtered air intake valve 102 for drawing filtered air into the tub assembly and directing the air into the lower air plenum 103, which is preferably located along the base of the tub assembly 100 for cooling purposes. Preferably, the upper portion of the air plenum 103 includes a plurality of holes arranged in square-like patterns for providing cooled air to the sub-pack assemblies 110a–c, which are located in the main chamber above the lower air plenum 103. Preferably, air jets (not shown) are positioned in the holes which are located along the length of the air plenum 103 for drawing the air along the length of the plenum 103, cooling the air, and forcing it up through the holes in order to cool the individual sub-pack assemblies 110a–c in the main chamber.

The capacitor tub assembly 100 further comprises management electronics 115 which are electrically coupled to the individual sub-pack assemblies 110a–c. These management electronics 115 include equalization circuitry for ensuring equalization of power and voltage over all the capacitors in the sub-pack assemblies 110a–c and voltage and temperature monitoring circuitry which ensure that the capacitors do not reach unsafe temperatures or pose dangerously high voltage threats to human personnel. The equalization circuitry preferably maintains a constant voltage level across all the capacitor cells. If any one capacitor cell is at a lower voltage level than the other cells, each of the other capacitor cells is discharged to that lower voltage level and then all of the capacitor cells are evenly re-charged to a desired voltage level. If any of the sub-pack assemblies reaches an undesirable or excessive temperature level, the voltage and temperature monitoring circuitry will activate the air jets, drawing air from the lower air plenum 103 into the sub-pack assemblies, in order to cool the individual capacitor cells at all four quarters.

The capacitor tub assembly 100 of the present invention also includes rapid discharge circuitry 145 which is coupled between the sub-pack assemblies 110a–c and the heatsink 150. The rapid discharge circuitry 145 will rapidly discharge each of the individual capacitor cells in the tub assembly 100 in the event of a system error or default, in order to avoid injury to human personnel. A preferred embodiment of the rapid discharge circuitry 145 is described in greater detail further hereinafter.

As explained earlier, and as further set forth hereinafter, the capacitor tub assembly 100 includes groups of sub-pack assemblies 110a–c comprised of capacitor cells arranged in arrays. The individual capacitor cells within each sub-pack assembly 110a–c are coupled electrically in series via printed circuit boards (PCB) 120a–b which are preferably located atop and under the sub-pack assemblies 110a–c. Each sub-pack 110 is also coupled to at least two of the adjacent sub-pack assemblies such that all the sub-pack assemblies are electrically coupled together in a serial fashion.

In a preferred embodiment, each PCB 120 includes a number of holes which are positioned in square-like patterns and which align with the holes in the air plenum 103 such that the air forced from the plenum 103 flows through the lower PCB 120a, cooling the quarters of each individual capacitor in the sub-pack assemblies 110, and out through the top of the upper PCB 120b and into the return air flow path 130.

The capacitor tub assembly 100 of the present invention is further comprised of a high voltage interlock (HVIL) switch 125. The HVIL switch is a two wire connection between high voltage components in the electric vehicle and the capacitor tub assembly. The HVIL switch prevents these components from being energized if any one of them is not properly installed within the vehicle. In a preferred embodiment, the HVIL switch also works in an opposite direction. If the vehicle is in an energized or powered state and any one of the high voltage components within the vehicle is compromised, the HVIL signals the main controller in the vehicle to de-energize the vehicle and the HVIL also discharges the capacitor tub assembly down to a safe voltage level.

Sub-pack Assembly Design

In a preferred embodiment, the capacitor tub assembly of the present invention will include 420 capacitor cells arranged in sub-packs of 12 cells per sub-pack. Accordingly, in a preferred embodiment, the capacitor tub assembly of the present invention will include 35 sub-packs 110a with 12 capacitor cells per sub-pack FIG. 2 illustrates a top-side view of a preferred embodiment of an individual capacitor sub-pack 110 for use in the capacitor tub assembly 100 of the present invention.

Figure 2:
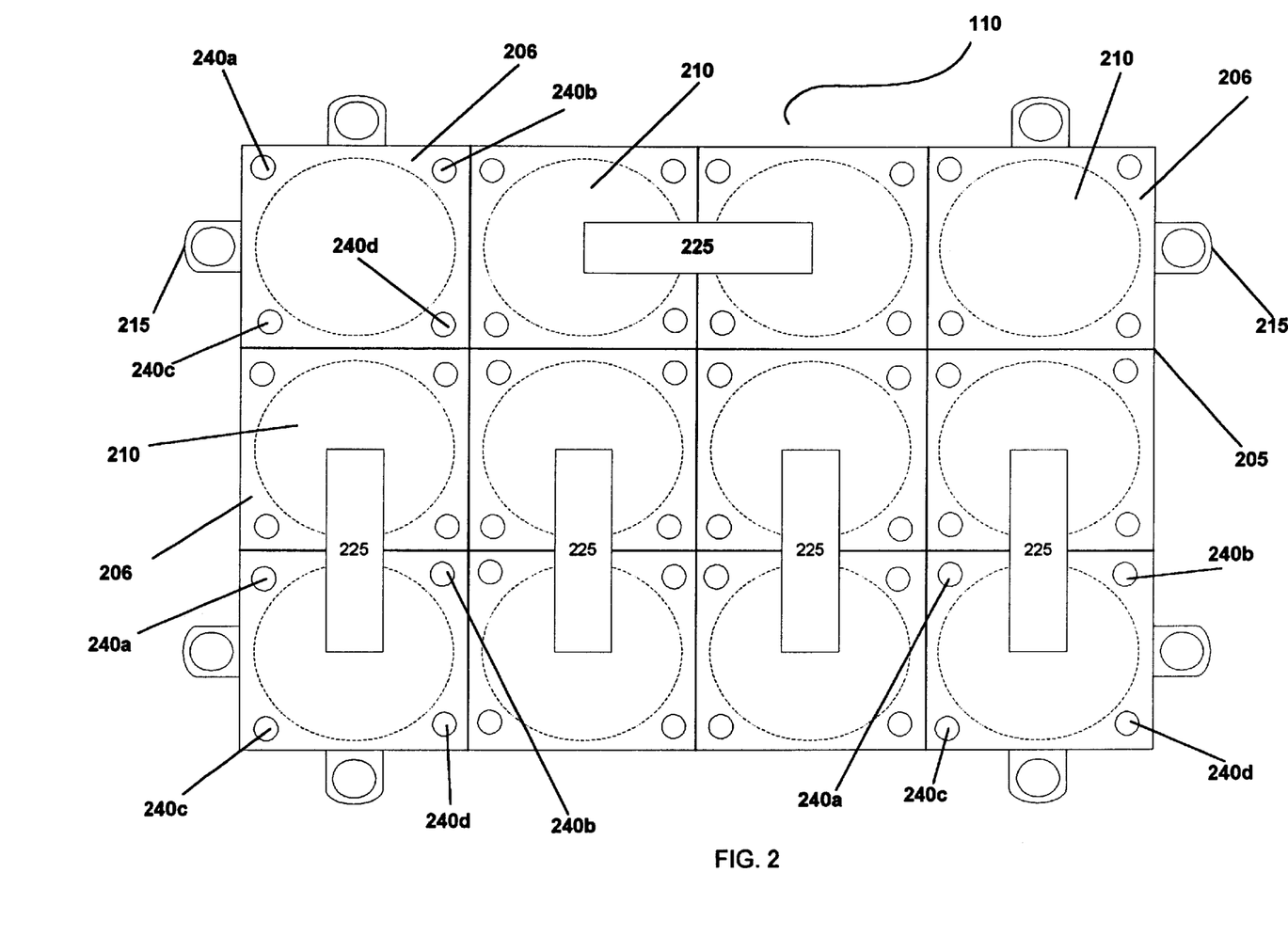
FIG. 2 is a top-side view of an individual capacitor sub-pack assembly for use in the capacitor tub assembly of the present invention.

As shown in FIG. 2, the sub-pack 110 is preferably comprised of an outer casing structure 205 having a number of inner cubicles 206. The outer casing structure 205 is preferably comprised of a non-conductive material and is designed to provide necessary mechanical support and constraint against vibration and significant "g" loads. Preferably, the capacitor tub assembly will be utilized in an electric vehicle and able to withstand "g" load of up to 5-g impact, although the assembly can be sized and modified for other applications.

In a preferred embodiment, the capacitor cells 210 in each sub-pack assembly are preferably cylindrical in shape and are arranged vertically in series in the inner cubicles 206 within the interior of the sub-pack 110. The inner cubicles 206 are preferably arranged in a three-by-four (3×4) pattern which is one cell deep (i.e. preferably the capacitor cells are not stacked), although it is understood that alternate arrangements are possible. Each sub-pack 10 is preferably fitted with hold down tabs 215 located along the top and bottom of the outer casing structure 205 of the sub-pack 110 for coupling the sub-packs to the individual PCBs 102a–b (the upper and lower PCBs) which are located along the top and bottom of each sub-pack. Accordingly, the capacitor cells are physically constrained within their individual cubicles via the PCBs 102a–b positioned at the top and bottom of each sub-pack 110. Since the PCBs also provide physical support to the structure and restrict the individual capacitor cells within their inner cubicles 206, the PCBs used in the present invention are made thicker than standard PCBs used in conventional consumer electronics. In a preferred embodiment, the PCBs will have a desired thickness of 0.125" in order to properly support the capacitors within the tub assembly. It is understood alterative thickness for each PCB is possible, depending on the size of the tub assembly and the design requirements for any one particular application.

In a preferred embodiment, the individual capacitor cells within each sub-pack are electrically coupled to one another in series, via conductive interconnect strips 225 located on the surface of the PCBs 102a–b. Additionally, as further described hereinafter, the PCBs 102a–b are equipped with holes 240a–d which allow air to flow from the lower plenum 103 into the cubicles 206 and out through the air flow return path. Preferably, these holes 240a–d are arranged in square-like patterns, and will preferably be positioned at the corners of each cubicle such that each capacitor cell will be cooled by air at all four quarters.

PCB Layout and Design

Figure 3:
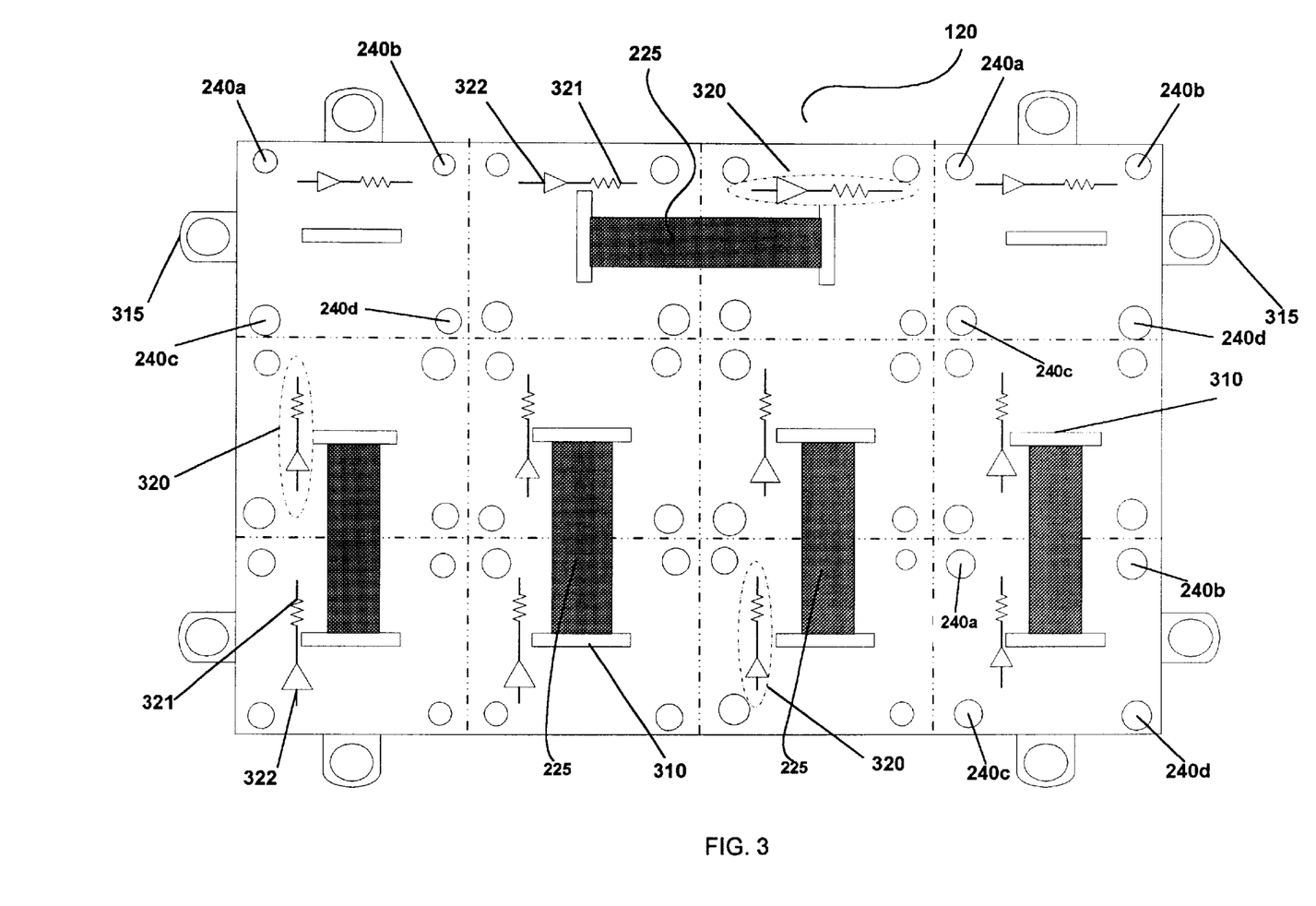
FIG. 3 is a top level view of a PCB used for coupling the capacitor cells within each sub-pack.

As explained earlier with reference to FIG. 1 and FIG. 2, the individual sub-packs 110 are all arranged in an array and individual capacitor cells within each sub-pack 110 are electrically coupled together via PCBs 120a–b which overlay the top and bottom of each of the sub-packs within the capacitor tub assembly 100 and which physically constrain the individual capacitor cells within each of their own inner cubicles 206. FIG. 3 provides a top level view of an individual PCB 120 used for coupling the capacitor cells within each sub-pack 110.

As shown in FIG. 3, in a preferred embodiment, each PCB 120 provides electrical coupling between the individual capacitor cells within a sub-pack via capacitor terminal pass-through ports 310 which are located at various locations within the PCB designed to accommodate the tabs on an capacitor cell when the cell is placed in its individual cubicle in an upright or vertical fashion. The pass-through ports 310 are electrically coupled via conductive interconnect strips 225 located on the face of the PCB 120. In a preferred embodiment, the PCB will also include individual trace connections (not shown) for the voltage and temperature sensing of each individual capacitor cell within each sub-pack 110. The PCB will also preferably provide the necessary equalization circuitry 320 for each capacitor cell within a sub-pack. Preferably, this equalization circuitry is comprised of a diode 321 and resistor 322 assembly.

As illustrated in FIG. 3, the PCB 120 also includes a number of holes 240a–d which are arranged in square-like patterns which aline with the four corners of each cubicle in a sub-pack, along with the holes in the air plenum 103; such that the air forced from the plenum 103 flows through the lower PCB 102a into each of the individual cubicles which hold the sub-pack assemblies, cooling the capacitors at each quarter, and out through the top PCB 102b and into a return air flow path 130.

Figure 4:
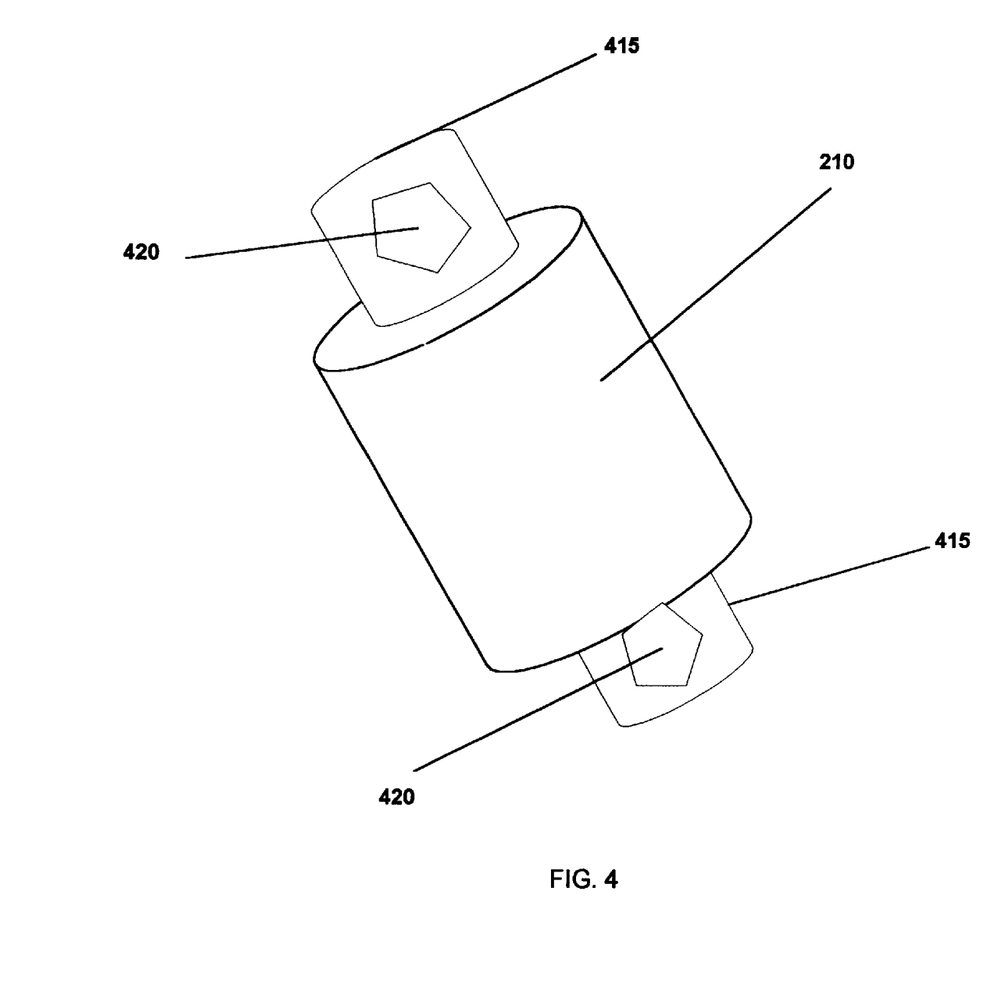
FIG. 4 is perspective view of a preferred embodiment of an individual capacitor cell 210 used in the tub assembly of the present invention.

FIG. 4 illustrates a preferred embodiment of an individual capacitor cell 210 used in the tub assembly of the present invention. As shown, in a preferred embodiment, the capacitor cells 210 are cylindrical in shape and each capacitor cell has tabs 415 which extend outward from the ends of the cylinder. These tabs 415 extend through the pass-through ports 310 located in the upper and lower PCBs 120a–b. Accordingly, as described earlier, the pass-through ports 310 on the PCBs are positioned at locations for accommodating the individual tabs 415 on the cylindrical shaped capacitor cells. In a preferred embodiment, the tabs 415 on the ends of each cylindrical capacitor cell are folded over after they extend beyond the pass-through ports 310 and are electrically coupled together via the conductive interconnect strips 225 located on the face of the board, thereby providing the electrical connection between the individual capacitors within each sub-pack. Additionally, at least two of the individual capacitors in each sub-pack will have their tabs coupled to tabs from capacitors in adjacent sub-packs located within the capacitor tub assembly 100, such that all the sub-packs within the entire capacitor tub assembly 100 are electrically coupled together in series. In one preferred embodiment, the tabs 415 on the ends of each cylindrical capacitor include an embedded nut 420 such that the tabs from adjacent cells can be folded over and coupled to the conductive interconnect strips preferably using a washer and screw type arrangement.

Cooling Design

Referring again to FIG. 1 and FIG. 3, they illustrate the general concept of the cooling design implemented in the capacitor tub assembly 100 of the present invention. A filtered air intake valve 102 draws filtered air into the air plenum 103 located along the base of the tub assembly 100 for cooling purposes. The air is drawn through the filtered air intake valve 102 and into the air plenum 103 located along the bottom of the assembly 100. The upper portion of the air plenum 103 includes a plurality of holes for providing cooled air to the sub-pack assemblies 110a–c. Preferably, air jets (not shown) are provided along the length of the air plenum 103 for drawing the air along the plenum, cooling the air, and forcing it up through the holes in order to cool the individual sub-pack assemblies 110a–c. In a preferred embodiment, the jets are sized to maintain the same pressure drop across each jet in order to ensure each capacitor cell receives an equal amount of air. The jets may be positioned in either the lower PCB or the top surface of the lower air plenum 103, depending upon design and cost considerations. Furthermore, in a preferred embodiment, the air plenum 103 cross-section is tapered in order to maintain the same amount of air across each capacitor 210 during the cooling process.

In a preferred embodiment, the PCB 120 includes a number of holes 240a–d which aline with the holes in the air plenum 102 such that the air forced from the plenum 102 flows through the lower PCB 102a, into the cubicles where the sub-pack assemblies are housed, cooling the capacitors from all four quarters, and out through the upper PCB 102 and into a return air flow path 130. In a preferred embodiment, the return air flow path 130 has an increasing taper to accommodate the increasing volume of air over the length of the path.

Rapid Discharge Circuitry Design

As described earlier, in a preferred embodiment, the capacitor tub assembly of the present invention will preferably include 420 capacitors serially coupled and arranged in sub-packs. In a preferred embodiment, each capacitor will be rated at approximately 2000 Farads and is capable of attaining a maximum voltage of approximately 2.5 Volts. Accordingly, the total capacitance of the capacitor tub assembly of the present invention may reach 4.8 Farads with a maximum total voltage of 1050 Volts. In the event of a system fault or exposure of electrical potentials to human personnel, it is necessary to be able to immediately and rapidly discharge the capacitor cells. Thus, the present invention is equipped with rapid discharge circuitry.

Figure 5:
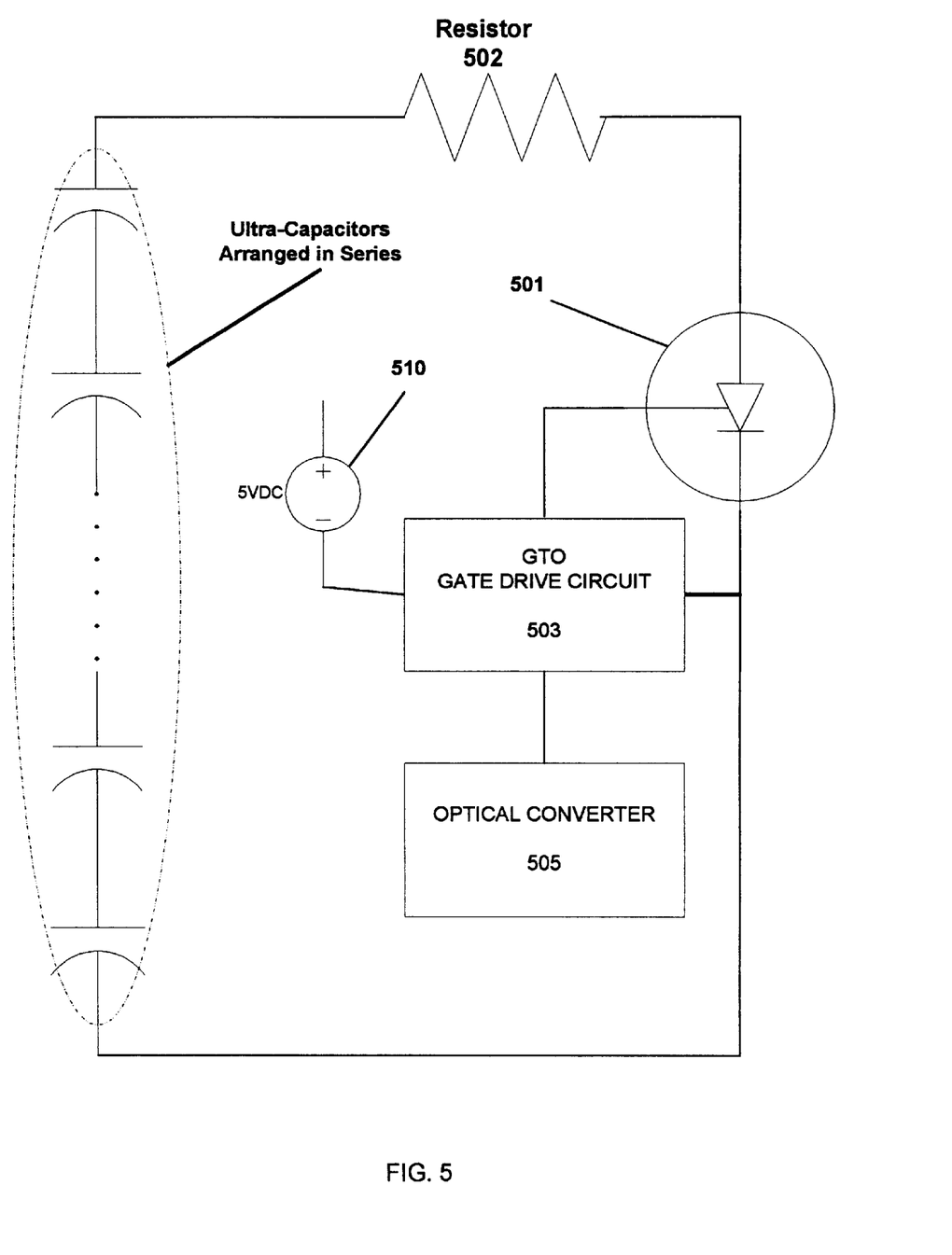
FIG. 5 is a schematic diagram which illustrates a preferred embodiment of the rapid discharge circuitry implemented within the capacitor tub assembly of the present invention.

FIG. 5 illustrates a preferred embodiment of the rapid discharge circuitry 145 implemented within the capacitor tub of the present invention. As shown, the rapid discharge circuitry is comprised of a Gate Turn Off (GTO) Thyristor 501 coupled in series with the capacitors and a resistor 502. The rapid discharge circuitry 145 further includes, a GTO Gate Drive Circuit 503 coupled to the GTO Thyristor 501 for controlling the gate operations of the GTO Thyristor 501, an optical converter 505 coupled to the GTO Gate Drive Circuit 503, and a power supply 510 coupled to the GTO Gate Drive Circuit 502. In a preferred embodiment, the power supply 510 is designed to provide between 5 and 20 Volts DC and 10 and 6 amps of current.

In operation, a discharge signal is generated by the optical converter 505 and transmitted to the GTO Gate Drive Circuit 503. When this signal is received, the GTO Gate Drive Circuit 503 enables the GTO Thyristor 501, and energy stored in the capacitors is allowed to dissipate through the device within the series loop. All the energy is converted into heat, which is then passed to the outside environment via the heat sink 150 and the air flow return path 130 of the capacitor tub assembly of the present invention. In a preferred embodiment, the discharge signal is a 5VDC signal which is received by the optical converter and converted into an optical activation signal which is transmitted to the GTO Gate Drive Circuit and enables the driver to active the gate on the GTO Thyristor.

Voltage and Temperature Management Circuitry

The voltage and temperature sensing is preferably accomplished through the use of circuitry on the PCBs and existing measurement and controller hardware, such as the SmartGuard® FC and Battery System Controller (BSC). In a preferred embodiment, measurement traces for measuring voltage of each individual capacitor will be built directly into the PCBs 120 and they will be coupled to the SmartGuard® FC. Accordingly, the SmartGuard® FC will be contained within the capacitor tub assembly of the present invention as fully integrated system. In a preferred embodiment, the SmartGuard® FC is coupled to the BSC via a dedicated two-wire, optically isolated bus. Accordingly, the BSC will preferably be maintained exterior to the capacitor tub assembly.

Filtered Air Intake Valve Design

Since forced air cooling is used in a preferred embodiment of the present invention, the air must be treated and filtered, otherwise, ingesting moisture or any debris into the assembly will pose significant risk and inhibit proper operation of the system. For example, dust and moisture can form dangerous conductive paths across high voltage elements and may cause the system to fail. Accordingly, in a preferred embodiment of the present invention the filtered air intake valve 102 will actually be comprised of an air filtration system and a passive water intrusion flap.

Method of Fabrication

The present invention includes a method of manufacturing an capacitor tub assembly comprising the steps of arranging a plurality of cylindrically shaped capacitors having top and bottom ends into an array called a sub-pack, physically coupling top and bottom PCBs to the plurality of capacitors at their respective top and bottom ends, in order to physically restrict each of the capacitors within the sub-pack, said PCBs each having a plurality of holes which are uniformly spaced about the circumference of each capacitor; and providing a forced air cooling system which cools the cylindrically shaped capacitors, said system providing air toward each of the capacitors from at least four directions by directing air toward each capacitor through the plurality of holes in the PCBs which are uniformly spaced about the circumference of each capacitor. In a preferred embodiment, the capacitors are all electrically coupled together in a serial fashion via the PCBs.

The method further includes the steps of coupling voltage equalization circuitry to the sub-pack in order to ensure equal distribution of voltage and power over the plurality of capacitors; and coupling rapid discharge circuitry to the sub-pack for quicky discharging any one of or all of the capacitors in the plurality. In a preferred embodiment, temperature monitoring circuitry is also coupled to the sub-packs in order to measure the temperatures of the plurality of capacitors.

In a preferred embodiment, the plurality of capacitors in each sub-pack are cylindrically shaped and have extension tabs at each end. The capacitors are arranged vertically in side by side cubicles, one capacitor per cubicle. The capacitors in each sub-pack are coupled in series using the PCBs; and each individual sub-pack is further coupled to at least two other adjacent sub-packs, such that all the sub-packs are electrically coupled together in series by coupling the PCBs. Preferably, the PCBs are equipped with pass through ports for accommodating the extension tabs on the ends of the capacitors, said extension tabs being arranged through said pass through ports, folded over, and electrically and physically coupled via the PCB.

In a preferred embodiment of the present invention, the rapid discharge circuitry is comprised of a Gate Turn Off (GTO) Thyristor coupled in series with the capacitors, a GTO Gate Drive Circuit coupled to the GTO Thyristor for controlling the gate operations of the GTO Thyristor, and an optical converter coupled to the GTO Gate Drive Circuit for activating the GTO Gate Drive Circuit.

When constructing the tub assembly of the present invention, a forced air cooling system is implemented in order to cool each of the individual capacitor cells. Instead of simply blowing air across the capacitor cells in one direction, the cells are cooled from all four quarters. This is accomplished by providing a filtered air intake valve having an air filtration system and a passive water intrusion flap for providing filtered air to the forced air cooling and using fans to cool the filtered air and provide the cooled filtered air to each quarter of each capacitor in the plurality in order to prevent overheating of the sub-packs.

The foregoing description details certain preferred embodiments of the present invention and describes the best mode contemplated for assembling the invention. However, the invention is not intended to be limited by the language used in said above referenced description and is only intended to be limited by the appended claims and any equivalents thereof.

What is claimed:

1. A capacitor tub assembly comprising:
   a. a plurality of cylindrically shaped capacitors having top and bottom ends;
   b. top and bottom printed circuit boards (PCBs) physically coupled to the plurality of capacitors at their respective top and bottom ends, to physically restrict each of the capacitors at their top and bottom ends, said PCBs each having a plurality of holes which are uniformly spaced about the circumference of each capacitor; and
   c. a forced air cooling system which directs cooling air to each of the capacitors from at least four directions by directing air toward each capacitor through the plurality of holes which are uniformly spaced about the circumference of each capacitor in the bottom end PCB.

2. The capacitor tub assembly of claim 1, wherein the top and bottom PCBs are configured to electrically couple the plurality of capacitors to each other in a serial fashion.

3. The capacitor tub assembly of claim 1, further comprising:
   a. voltage equalization circuitry coupled to each of the capacitors in order to ensure equal distribution of voltage over the plurality of capacitors; and
   b. rapid discharge circuitry coupled to each capacitor in the plurality, for quickly discharging any one of or all of the capacitors in the plurality if the voltage is not equally distributed over the plurality of capacitors.

4. The capacitor tub assembly of claim 1, further comprising temperature monitoring circuitry coupled to the plurality of capacitors for measuring temperatures of the plurality of capacitors.

5. The capacitor tub assembly of claim 1, wherein
   a. the top and bottom ends of the capacitors have extension tabs; and
   b. the PCBs are equipped with pass through ports for accommodating the extension tabs on the respective top and bottom ends of the capacitors, said extension tabs being arranged through said pass through ports, folded over, and physically coupled to the PCB.

6. The capacitor tub assembly of claim 3, wherein the rapid discharge circuitry is comprised of:
   a. a Gate Turn Off (GTO) Thyristor coupled in series with the capacitors,
   b. a GTO Gate Drive Circuit coupled to the GTO Thyristor for controlling the gate operations of the GTO Thyristor, and
   c. an optical converter coupled to the GTO Gate Drive Circuit for activating the GTO Gate Drive Circuit.

7. The capacitor tub assembly of claim 1, further comprising a filtered air intake valve coupled and designed to provide filtered air to the forced air cooling system, the filtered air intake valve including:
   a. an air filtration system for receiving and filtering air; and
   b. a passive water intrusion flap for drawing any residual moisture from the filtered air.

8. A method of manufacturing a capacitor tub assembly comprising:
   a. arranging a plurality of cylindrically shaped capacitors having top and bottom ends into an array called a sub-pack;
   b. physically coupling top and bottom PCBs to the plurality of capacitors at their respective top and bottom ends, in order to physically restrict each of the capacitors within the sub-pack, said top and bottom PCBs each having a plurality of holes which are uniformly spaced about the circumference of each capacitor; and
   c. providing a forced air cooling system which cools the cylindrically shaped capacitors, said system providing air toward each of the capacitors from at least four directions by directing air toward each capacitor through the plurality of holes in the bottom PCB.

9. The method of claim 8, electrically coupling the capacitors in a serial fashion via the PCBs.

10. The method of claim 8, further comprising:
    a. coupling voltage equalization circuitry to the sub-pack in order to ensure equal distribution of voltage and power over the plurality of capacitors; and
    b. coupling rapid discharge circuitry to the sub-pack for quicky discharging any one of or all of the capacitors in the plurality of the voltage is not equally distributed over the plurality of the capacitors.

11. The method of claim 8, further comprising the additional step of coupling temperature monitoring circuitry to the sub-pack in order to measure the temperature of the plurality of capacitors in the sub-pack.

12. The method of claim 8, wherein each capacitor in the plurality has extension tabs at the bottom end and top end and the top and bottom PCBs are both equipped with pass through ports for accommodating the extension tabs on the ends of the capacitors, said method further comprising:
    a. arranging the extension tabs on the top and bottom ends of each capacitor through said pass through ports in the top and bottom PCBs,
    b. folding over the extension tabs,
    c. physically and electrically coupling the extension tabs to the top and bottom PCBs.

13. The method of claim 10, wherein the rapid discharge circuitry is comprised of:
    a. a Gate Turn Off (GTO) Thyristor coupled in series with the capacitors,
    b. a GTO Gate Drive Circuit coupled to the GTO Thyristor for controlling the gate operations of the GTO Thyristor, and
    c. an optical converter coupled to the GTO Gate Drive Circuit for activating the GTO Gate Drive Circuit.

14. The method of claim 8, comprising the additional steps of:
    a. providing a filtered air intake valve for receiving air and filtering said air, thereby generating filtered air;
    b. removing any residual water molecules from said filtered air using a passive water intrusion flap, and
    c. providing the filtering the air to the forced air cooling system.

15. A means for storing voltage used for powering an electric vehicle, said means comprising:
    a. a plurality of capacitor cells arranged into a sub-pack array having a top end and a bottom end;
    b. top and bottom printed circuit boards (PCBs) arranged at the top and bottom ends of the sub-pack array for physically restricting the plurality of capacitor cells within the sub-pack array; said top and bottom PCBs each having a plurality of holes which are uniformly spaced about the circumference of each capacitor and
    c. a forced air cooling system which provides cooling air to each of the capacitor cells in the plurality from at least four directions in order to prevent overheating of the sub-pack array, said forced air cooling system providing cooling air to the capacitors by directing cooling air through the plurality of holes in the bottom PCB toward the capacitors.

16. The means for storing voltage used for powering an electric vehicle as in claim 15, further comprising:
    a. voltage equalization circuitry coupled to the sub-pack for ensuring equal distribution of voltage over the plurality of capacitor cells; and
    b. rapid discharge circuitry coupled to the sub-pack for quickly discharging any one or all of the capacitor cells in the plurality.

17. The means for storing voltage used for powering an electric vehicle, as in claim 15, further comprising temperature monitoring circuitry coupled to the sub-pack for determining the temperature of the plurality of capacitor cells in the sub-pack.

18. The means for storing voltage used for powering an electric vehicle, as in claim 15, wherein the plurality of capacitor cells are cylindrically shaped, have extension tabs at each end, and are arranged vertically side by side in the sub-pack array.

19. The means for storing voltage used for powering an electric vehicle, as in claim 18, wherein the plurality of capacitor cells are all electrically coupled together in a serial fashion using the PCBs.

20. The means for storing voltage used for powering an electric vehicle, as in claim 18, wherein the top and bottom PCBs are both equipped with pass through ports for accommodating the extension tabs on the ends of the capacitor cells, said extension tabs being arranged through said pass through ports, folded over, and physically coupled to the top and bottom PCBs.

21. The means for storing voltage used for powering an electric vehicle, as in claim 16, wherein the rapid discharge circuitry is comprised of:

a. a Gate Turn Off (GTO) Thyristor coupled in series with the capacitors, b. a GTO Gate Drive Circuit coupled to the GTO Thyristor for controlling the gate operations of the GTO Thyristor, and c. an optical converter coupled to the GTO Gate Drive Circuit for activating the GTO Gate Drive Circuit.

22. The means for storing voltage used for powering an electric vehicle, as in claim 15, further comprising:

a. a filtered air intake valve for receiving air and filtering said air; and b. a passive water intrusion flap for removing any residual water molecules from the filtered air and providing filtered air to the forced air cooling system.

23. A forced air cooling system which provides cooling air to a plurality of capacitors comprising:

a. a filtered air intake valve comprised of an air filtration system and a passive water intrusion flap for receiving air, filtering the air and providing filtered air to the capacitors via a lower plenum;

b. a plurality of holes in the lower plenum which are uniformly spaced about the circumference of each capacitor, for providing the filtered air to each capacitor in the plurality from at least four directions.

24. The forced air cooling system of claim 23, wherein the plurality of capacitors are cylindrically shaped and are arranged vertically in side by side cubicles having four corners, one capacitor per cubicle, and wherein said plurality of holes are arranged in square-like patterns in the lower plenum so as to coincide with the four corners of each cubicle.

25. A method for cooling a capacitor tub assembly having a plurality of capacitors arranged vertically in a sub-pack, the method comprising:

a. physically coupling top and bottom PCBs to the plurality of capacitors at their respective top and bottom ends, in order to physically restrict each of the capacitors within the sub-pack, said PCBs each having a plurality of holes which are uniformly spaced about the circumference of each capacitor; and a. providing cooling air toward each of the capacitors from at least four directions by directing air toward each capacitor through the plurality of holes in the bottom PCB.

\* \* \* \* \*